United States Patent
Wang et al.

(10) Patent No.: US 11,821,969 B2
(45) Date of Patent: Nov. 21, 2023

(54) MRI SYSTEM, AND METHOD AND DEVICE FOR DETERMINING WAVEFORM OF OBLIQUE SCANNING

(71) Applicant: GE Precision Healthcare LLC, Wauwatosa, WI (US)

(72) Inventors: Pengshuai Wang, Beijing (CN); Xuan Liu, Beijing (CN); Yongchuan Lai, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/891,826

(22) Filed: Aug. 19, 2022

(65) Prior Publication Data
US 2023/0080264 A1 Mar. 16, 2023

(30) Foreign Application Priority Data
Aug. 31, 2021 (CN) .......................... 202111017913.0

(51) Int. Cl.
*G01R 33/38* (2006.01)
*G01R 33/385* (2006.01)
*G01R 33/483* (2006.01)
*G01R 33/561* (2006.01)

(52) U.S. Cl.
CPC ..... *G01R 33/3852* (2013.01); *G01R 33/4833* (2013.01); *G01R 33/5614* (2013.01)

(58) Field of Classification Search
CPC ........... G01R 33/3852; G01R 33/4833; G01R 33/5614; G01R 33/385; G01R 33/543
See application file for complete search history.

(56) References Cited

U.S. PATENT DOCUMENTS

| | | | | |
|---|---|---|---|---|
| 5,512,825 A | * | 4/1996 | Atalar ................ | G01R 33/4833 324/309 |
| 6,188,219 B1 | * | 2/2001 | Reeder .................. | G01R 33/58 324/309 |
| 2020/0064426 A1 | * | 2/2020 | Ersoz ................. | G01R 33/3852 |

OTHER PUBLICATIONS

Atalar et al., "Minimization of dead-periods in MRI pulse sequences for imaging oblique planes", Magn Reson Med. Dec. 1994;32(6):773-7, 13 pages.

(Continued)

*Primary Examiner* — G. M. A Hyder

(57) ABSTRACT

The present disclosure relates to an MRI system and a method and device for determining a waveform of oblique scanning. Specifically, provided are a magnetic resonance imaging system, a method and device for determining a gradient waveform of oblique scanning, and a computer-readable storage medium. The method includes: generating an initial physical axis gradient waveform on a physical axis, the physical axis including a first physical axis, a second physical axis, and a third physical axis, wherein gradient waveforms on the three physical axes have the same inflection time; converting the initial physical axis gradient waveform into a logical axis gradient waveform, an inflection point of the logical axis gradient waveform being the same as the inflection time of the initial physical axis gradient waveform; re-converting the logical axis gradient waveform into a physical axis gradient waveform; and using, during the oblique scanning of magnetic resonance imaging, the converted physical axis gradient waveform to drive a gradient amplifier.

10 Claims, 10 Drawing Sheets

(56) References Cited

OTHER PUBLICATIONS

Derbyshire et al., "Efficient implementation of hardware optimized gradient sequences for real-time imaging", (2010), Magn. Reson. Med., 64: 1814-1820, 7 pages.

* cited by examiner

MRI SYSTEM, AND METHOD AND DEVICE FOR DETERMINING WAVEFORM OF OBLIQUE SCANNING

CROSS REFERENCE

The present application claims priority and benefit of Chinese Patent Application No. 202111017913.0 filed on Aug. 31, 2021, which is incorporated herein by reference in its entirety.

TECHNICAL FIELD

The present invention relates to the field of medical imaging, in particular to a magnetic resonance imaging (MRI) system, a method and device for determining a waveform of oblique scanning, and a computer-readable storage medium.

BACKGROUND

Magnetic resonance imaging (MRI) generates, by means of a main magnet, a constant main magnetic field having a high field intensity. When the human body or a part of the human body is placed in the main magnetic field, nuclei associated with hydrogen nuclei in tissue undergo spin polarization. A magnetic moment associated with these spins preferentially is in a direction consistent with a direction of the magnetic field, resulting in net tissue magnetization along the axis.

An MRI system further includes a gradient coil. The gradient coil uses orthogonal axes to generate a spatially varying magnetic field so as to spatially encode an MR signal by generating a characteristic resonance frequency in each location (slice) in the body.

A radio frequency (RF) coil is used to generate an RF energy pulse at a resonance frequency of the hydrogen nucleus or at a frequency near the resonance frequency. The RF energy pulse contributes energy to a nuclear spin system. During a process in which the nuclear spin relaxes so that a static energy state thereof is reached again, these nuclear spins release absorbed energy in the form of an RF signal. The signal is detected and reconstructed into an image by the MRI system.

Depending on clinical requirements, the aforementioned slice may include orthogonal planes along the orthogonal axes, or may include an oblique plane. For example, when cardiac imaging is performed, it is often necessary to perform imaging of an oblique plane. However, compared with orthogonal plane scanning, it is more difficult to acquire suitable scanning parameters (such as a sufficiently short scanning sequence repetition time TR, an echo time TE, and the like).

SUMMARY

An aspect of the present invention provides a magnetic resonance imaging method, comprising: generating an initial physical axis gradient waveform on a physical axis, the physical axis comprising a first physical axis, a second physical axis, and a third physical axis, wherein gradient waveforms on the first physical axis, the second physical axis, and the third physical axis comprised in the physical axis have the same inflection time. The method further includes converting the initial physical axis gradient waveform into a logical axis gradient waveform, an inflection point of the logical axis gradient waveform being the same as the inflection time of the initial physical axis gradient waveform. Moreover, the method includes re-converting the logical axis gradient waveform into a physical axis gradient waveform; and using, during the oblique scanning of magnetic resonance imaging, the converted physical axis gradient waveform to drive a gradient amplifier.

Another aspect of the present invention further provides a computer-readable storage medium, comprising a stored computer program, wherein the aforementioned method is performed when the computer program is run.

Another aspect of the present invention further provides a magnetic resonance imaging system which includes a gradient coil assembly comprising a first gradient coil, a second gradient coil, and a third gradient coil. The first gradient coil, the second gradient coil, and the third gradient coil define a first physical axis, a second physical axis, and a third physical axis, respectively. The system further includes a gradient coil driver having a first gradient amplifier, a second gradient amplifier, and a third gradient amplifier coupled to the first gradient coil, the second gradient coil, and the third gradient coil, respectively. The system also includes a processor, communicatively coupled to the gradient coil driver and configured to perform the following steps: 1) generate an initial physical axis gradient waveform on the physical axis, wherein gradient waveforms on the first physical axis, the second physical axis, and the third physical axis have the same inflection time; 2) convert the initial physical axis gradient waveform into a logical axis gradient waveform, an inflection time of the logical axis gradient waveform being the same as the inflection time of the initial physical axis gradient waveform; 3) re-convert the logical axis gradient waveform into a physical axis gradient waveform; and 4) using, during the oblique scanning of magnetic resonance imaging, the converted physical axis gradient waveform to drive the first gradient amplifier, the second gradient amplifier, and the third gradient amplifier.

Another aspect of the present invention provides a device for determining a gradient waveform of oblique scanning. The device includes a waveform generation module for generating an initial physical axis gradient waveform on a physical axis, the physical axis comprising a first physical axis, a second physical axis, and a third physical axis, wherein gradient waveforms on the first physical axis, the second physical axis, and the third physical axis comprised in the physical axis have the same inflection time. The device also includes a first waveform conversion module for converting the initial physical axis gradient waveform into a logical axis gradient waveform, an inflection point of the logical axis gradient waveform being the same as the inflection time of the initial physical axis gradient waveform. The device further includes a second waveform conversion module for re-converting the logical axis gradient waveform into a physical axis gradient waveform; and an amplifier driving module for using, during the oblique scanning of magnetic resonance imaging, the converted physical axis gradient waveform to drive a gradient amplifier.

It should be understood that the brief description above is provided to introduce, in simplified form, some concepts that will be further described in the Detailed Description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where FIG. 1 schematically shows a structural block diagram of a magnetic resonance imaging (MRI) system according to some embodiments of the present invention.

DETAILED DESCRIPTION

Specific implementations of the present invention will be described below. It should be noted that in the specific description of these embodiments, for the sake of brevity and conciseness, this specification may not describe all features of the actual implementations in detail. It should be understood that in the actual implementation process of any implementations, just as in the process of any engineering project or design project, a variety of specific decisions are often made to achieve specific goals of the developer and to meet system-related or business-related constraints, which may also vary from one implementation to another. Furthermore, it should also be understood that although efforts made in such development processes may be complex and tedious, for those of ordinary skill in the art related to the content disclosed in the present invention, some design, manufacture or production changes on the basis of the technical content disclosed in the present disclosure are only common technical means, and should not be construed as insufficient content of the present disclosure.

Unless otherwise defined, the technical or scientific terms used in the claims and the description are as they are usually understood by those of ordinary skill in the art to which the present invention pertains. Terms such as "first," "second," and similar terms used in this specification and claims do not denote any order, quantity, or importance, but are only intended to distinguish different constituents. The term "one" or "a/an" and similar terms do not denote a limitation of quantity, but rather the presence of at least one. The term "include" or "comprise" and similar terms mean that an element or article preceding the term "include" or "comprise" encompass elements or articles and equivalent elements thereof listed following the term "include" or "comprise," and do not exclude other elements or articles. The term "connect" or "connected" and similar words are not limited to physical or mechanical connections, and are not limited to direct or indirect connections.

Figure 1:
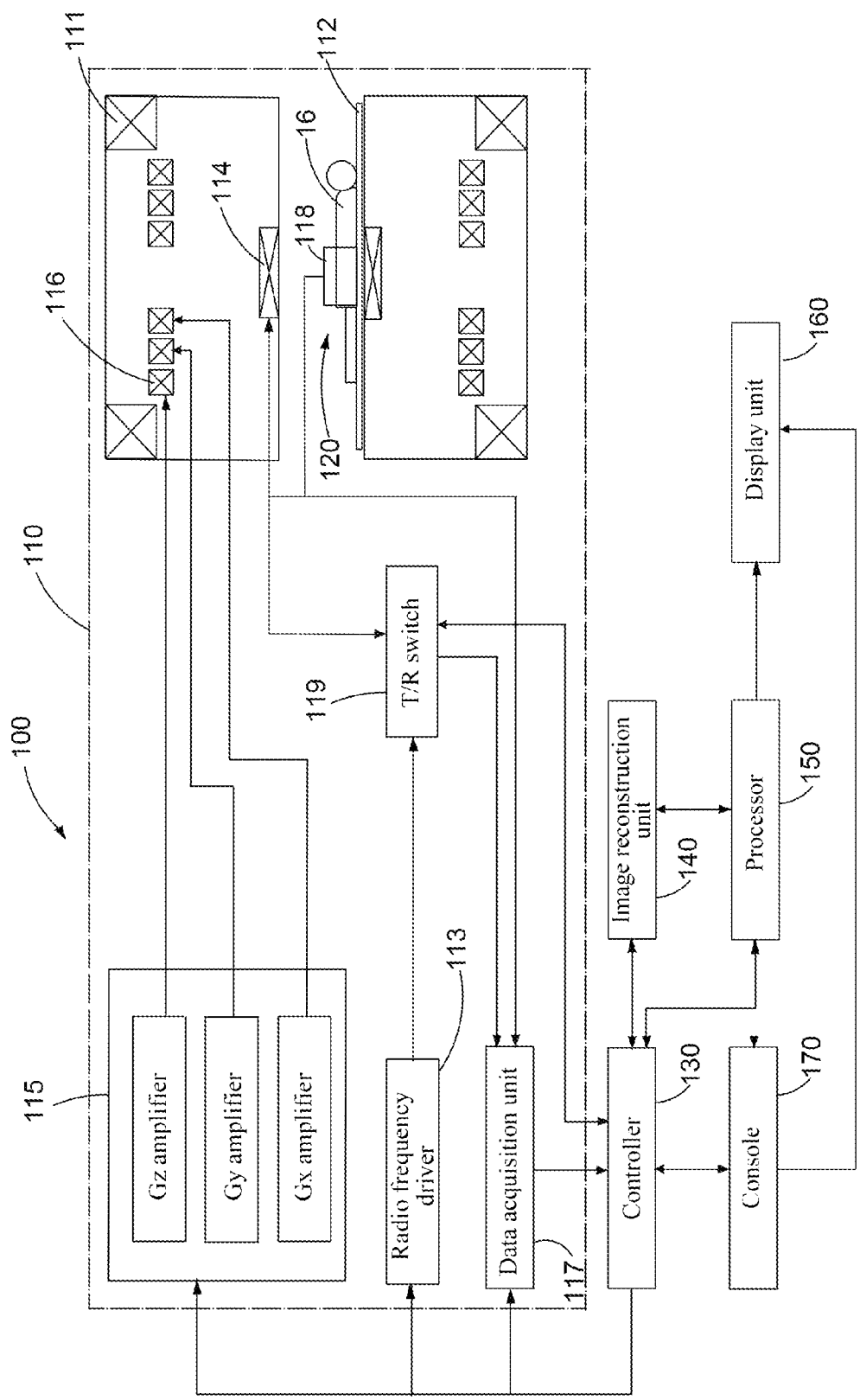

The following description relates to a method for determining a waveform of oblique scanning in an MRI system. FIG. 1 shows a magnetic resonance imaging (MRI) system 100 according to some embodiments of the present invention.

The MRI system 100 includes a scanner 110. The scanner 110 is configured to perform a magnetic resonance scan of a subject (e.g., a human body) 16 to generate image data of a region of interest of the subject 16, wherein the region of interest may be a pre-determined anatomical site or anatomical tissue.

The magnetic resonance imaging system 100 may include a controller 130 coupled to the scanner 110 so as to control the scanner 110 to perform the aforementioned magnetic resonance scanning procedure.

The scanner 110 may include a main magnet assembly 111. The main magnet assembly 111 usually includes an annular superconducting magnet defined in a housing. The annular superconducting magnet is mounted in an annular vacuum container. The annular superconducting magnet and the housing thereof define a cylindrical space surrounding the subject 16, such as an imaging space 120 shown in FIG. 1. The main magnet assembly 111 generates a constant magnetic field, i.e., a B0 field, in a Z direction of the imaging space 120.

Usually, the Z direction is typically the direction extending from the head to the feet (or from the feet to the head) when the subject 16 is positioned on the table 112. For example, a selected layer may be a slice at any position in the Z direction. A uniform portion of the B0 field is formed in a central region of the main magnet.

The scanner 110 further includes a table 112 configured to carry the subject 16 and travel, in response to the control of the controller 130, in the Z direction to enter or exit the scanning chamber 120. For example, in an embodiment, an imaging volume of the subject 16 may be positioned in a central region of the imaging space 120 having uniform magnetic field strength, so as to facilitate scanning and imaging of the imaging volume of the subject 16.

The magnetic resonance imaging system 100 uses the formed B0 field to transmit a static magnetic field to the subject 16 located in the scanning chamber, so that protons in a resonant region in the body of the subject 16 precess in an ordered manner.

The scanner 110 further includes a radio frequency driver 113 and a radio frequency transmitting coil 114. The radio frequency transmitting coil 114 is configured, for example, to surround a region to be imaged of the subject 16. The radio frequency transmitting coil 114 may include, for example, a body coil disposed along an inner circumference of the main magnet, or a local coil dedicated to local imaging. The radio frequency driver 113 may include a radio frequency generator (not shown in the figure), a radio frequency power amplifier (not shown in the figure), and a gate modulator (not shown in the figure). The radio frequency driver 113 is configured to drive the radio frequency transmitting coil 114 and form a high-frequency magnetic field in space. Specifically, the radio frequency generator generates a radio frequency excitation signal on the basis of a control signal from the controller 130. The gate modulator modulates the radio frequency excitation signal into a signal having a predetermined envelope and predetermined timing. After being amplified by the radio frequency power amplifier, the modulated radio frequency excitation signal is outputted to the radio frequency transmitting coil unit 114, so that the radio frequency transmitting coil 114 transmits, to the subject 16, a radio frequency field B1 orthogonal to the B0 field so as to excite a proton in a slice to be imaged to spin. After a radio frequency excitation pulse ends, a magnetic resonance signal is generated during a process in which spinning of the excited proton relaxes and a magnetization vector returns to the initial state.

The aforementioned radio frequency transmitting coil 114 may be connected to a transmitting/receiving (T/R) switch 119. The transmitting/receiving switch 119 is controlled so that the radio frequency transmitting coil may be switched between a transmitting mode and a receiving mode. In the receiving mode, the radio frequency transmitting coil may be configured to receive, from the subject 16, a magnetic resonance signal having three-dimensional location information.

The three-dimensional location information of the magnetic resonance signal is generated by means of a gradient system of the MRI system, and this will be described in detail below.

The scanner 110 further includes a gradient coil driver 115 and a gradient coil assembly 116. The gradient coil assembly 116, on the one hand, forms a magnetic field gradient (a varying magnetic field) in the imaging space 120 so as to provide three-dimensional location information for the magnetic resonance signal, and on the other hand generates a compensating magnetic field of the B0 field to shim the B0 field.

The gradient coil assembly 116 may include three gradient coil systems, and the three gradient coil systems are configured to respectively generate magnetic field gradients that are oblique to three spatial axes (for example, the X-axis, Y-axis, and Z-axis) perpendicular to each other. The gradient coil driver 115 drives the gradient coil assembly 116 on the basis of a control signal from the controller 130, and therefore generates the gradient magnetic field in the imaging space 120. The gradient coil driver 115 includes gradient amplifiers respectively corresponding to the three gradient coil systems in the aforementioned gradient coil assembly. For example, the gradient coil driver 115 includes a Gz amplifier configured to drive a gradient in a z direction, a Gy amplifier configured to drive a gradient in a y direction, and a Gx amplifier configured to drive a gradient in an x direction.

More specifically, the gradient coil assembly 116 is configured to apply a magnetic field gradient in a slice selection direction (e.g., the z direction) to vary field strength in the region, so that precession frequencies of protons of imaged tissue in different layers (slices) of this region are different and thus layer selection is performed. Those skilled in the art understand that the layer is any one of a plurality of two-dimensional slices distributed in the Z direction in the three-dimensional imaging volume. When the imaging region is scanned, the radio frequency transmitting coil 114 responds to the aforementioned radio frequency excitation signal, then a layer having a precession frequency corresponding to the radio frequency excitation signal is excited. Further, the gradient coil assembly 116 is configured to separately apply a magnetic field gradient in a phase-encoding direction (e.g., the y direction) and a magnetic field gradient in a frequency-encoding direction (e.g., the x direction), so that magnetic resonance signals of excited layers have different phases and frequencies, thereby achieving phase encoding and frequency encoding.

The scanner 110 further includes a surface coil 118 usually arranged close to a scanned part (a region of interest) of the subject 16 (for example, covering or disposed on the body surface of the subject 16), and the surface coil 118 is also configured to receive the magnetic resonance signal.

The scanner 110 further includes a data acquisition unit 117 configured to acquire the magnetic resonance signal (for example, received by the body coil or the surface coil) in response to a data acquisition control signal of the controller 130. In an embodiment, the data acquisition unit 117 may include, for example, a radio frequency preamplifier (not shown in the figure), a phase detector (not shown in the figure), and an analog/digital converter (not shown in the figure). The radio frequency preamplifier is configured to amplify the magnetic resonance signal. The phase detector is configured to perform phase detection on the amplified magnetic resonance signal. The analog/digital converter is configured to convert the phase-detected magnetic resonance signal from an analog signal into a digital signal.

The data acquisition unit 117 is further configured to store the digitized magnetic resonance signal (or echo) into a K space in response to a data storage control signal of the controller 130. The K-space is a space to which raw data of magnetic resonance signals carrying spatial orientation encoding information is populated. The data acquisition unit 117 fills signals with different phase information and frequency information in the corresponding locations in the K-space according to a predetermined data filling method. In an example, the two-dimensional K-space may include a frequency-encoding line and a phase-encoding line. Data acquisition at each level may include multiple signal acquisition cycles (or repetition times TR). Each signal acquisition cycle may correspond to one change in the magnetic field gradient (incrementally or decrementally) in the phase-encoding direction (i.e., one signal acquisition is performed for each phase-encoding gradient applied), and the magnetic resonance signal acquired in each signal acquisition cycle is filled into a frequency-encoding line. Through multiple signal acquisition cycles, multiple frequency-encoding lines having different phase information may be filled, and each acquired magnetic resonance signal has multiple decomposition frequencies.

The magnetic resonance imaging system 100 further includes an image reconstruction unit 140 configured to perform inverse Fourier transform on data stored in the K-space to reconstruct a three-dimensional image or a series of two-dimensional slice images of the imaging volume of the subject 16. Specifically, the image reconstruction unit 140 may perform the aforementioned image reconstruction on the basis of communication with the controller 130.

The magnetic resonance imaging system 100 further includes a processor 150. The processor 150 may include an image processor for image processing, and the image processor may perform any required image post-processing on the aforementioned three-dimensional image or any image in an image sequence. The post-processing may be an improvement or adaptive adjustment made to an image in any aspect of contrast, uniformity, sharpness, brightness, artifacts, etc. The processor 150 may further include a waveform processor configured to implement the waveform determination method according to an embodiment of the present invention. For example, the waveform processor generates a waveform on the basis of scanning parameters, performs waveform conversion, uses a converted waveform to determine driving/controlling parameters of the gradient amplifier, and the like.

In an embodiment, the controller 130, the image reconstruction unit 140, and the processor 150 may separately or collectively include a computer processor and a storage medium. The storage medium records a predetermined data processing program to be executed by the computer processor. For example, the storage medium may store a program configured to implement scanning processing (for example, including waveform design/conversion, and the like), image reconstruction, image processing, and the like. For example, the storage medium may store a program configured to implement the method for determining a gradient waveform of an oblique plane according to an embodiment of the present invention. The storage medium may include, for example, a ROM, a floppy disk, a hard disk, an optical disk, a magneto-optical disk, a CD-ROM, or a non-volatile memory card.

The magnetic resonance imaging system 100 further includes a display unit 160, and the display unit 160 may be configured to display an operation interface and various data, images, or parameters generated in data acquisition and processing processes.

The magnetic resonance imaging system 100 further an operation console 170, and the operation console 170 may include user input devices, such as a keyboard, a mouse, etc. The controller 130 may communicate with the scanner 110, the image reconstruction unit 140, the processor 150, the display unit 160, etc., in response to a control command generated by a user on the basis of the operation console 170 or an operation panel/button, etc., disposed on the housing of the main magnet.

Those skilled in the art can understand that when imaging scanning is performed on the subject 16, the controller 130 can send sequence control signals to the aforementioned components (for example, the radio frequency driver 113, the gradient coil driver 115, etc.) of the scanner 110 by means of a sequence generator (not shown in the figure), so that the scanner 110 performs a preset scanning sequence.

Those skilled in the art could understand that the term "scanning sequence" refers to a combination of pulses having specific amplitudes, widths, directions, and time sequences and applied when a magnetic resonance imaging scan is performed. The pulses may typically include, for example, a radio frequency pulse and a gradient pulse. The radio frequency pulses may include, for example, radio frequency transmission pulses, radio frequency refocus pulses, inverse recovery pulses, etc. The gradient pulses may include, for example, the aforementioned gradient pulse for layer selection, gradient pulse for phase encoding, gradient pulse for frequency encoding, phase balance pulse for phase balance of proton precession, etc. Typically, a plurality of scanning sequences can be pre-set in the magnetic resonance system, so that the sequence suitable for clinical detection requirements can be selected. The clinical detection requirements may include, for example, an imaging site, an imaging function, an imaging effect, and the like.

Magnetic resonance scanning parameters include parameters related to the aforementioned scanning sequences, such as a repetition time TR, an echo time TE, and an echo interval ESP. TR represents a time between respective centers of two adjacent radio frequency excitation pulses. TE represents a time from the center of the radio frequency excitation pulse to the center of an echo. ESP represents a time between respective centers of two adjacent echoes. In some applications, it is desirable to acquire shortest possible TR, TE, and ESP to ensure imaging quality.

In addition, the aforementioned gradient field can be considered as being oriented both in a physical plane and by the logical axis. In a physical sense, these fields are oriented orthogonally to each other to form a coordinate system, and the coordinate system can be rotated by appropriately manipulating a pulse current applied to an individual gradient field coil.

Therefore, performing magnetic resonance scanning on the subject 16 may include orthogonal plane (for example, axial imaging plane, sagittal imaging plane, or coronal imaging plane) scanning and oblique scanning, and this may be predetermined on the basis of a part to be imaged and clinical diagnostic requirements.

In orthogonal plane scanning, a physical gradient generated by the gradient coil unit 116 driven by the gradient amplifier can be configured with respect to the imaging system, so that the physical gradient aligns/coincides with the logical axis when imaging is performed in a reference axial imaging plane, a reference sagittal imaging plane, and a reference coronal imaging plane. For example, for axial imaging, coronal imaging, or sagittal imaging, the Gz amplifier can be configured to generate a slice selection gradient, the Gy amplifier can be configured to generate a phase-encoding gradient, and the Gx amplifier can be configured to generate a frequency-encoding gradient.

During oblique scanning, a logical axis-based coordinate system is rotated by a certain angle relative to a physical axis-based coordinate system. In this case, the slice selection gradient, the frequency-encoding gradient, and the phase-encoding gradient need to be defined in the logical axis-based coordinate system. The slice selection gradient determines a slice of tissue or anatomical structure to be imaged in a patient. Therefore, a slice selection gradient field can be applied simultaneously with a selective radio frequency excitation pulse to excite spin volumes in oblique slices precessing at the same frequency. A slice thickness is determined by a bandwidth of the radio frequency excitation pulse and gradient strength in an entire field of view.

A frequency-encoding gradient axis (also referred to as a readout gradient axis) is present in the logical axis-based coordinate system in a direction perpendicular to the slice selection gradient. Generally, a frequency-encoding gradient is applied before and during formation of an MR echo signal caused by radio frequency excitation. Under the influence of the gradient, spins of a gyromagnetic material are frequency-encoded according to spatial locations of these spins in the entire gradient field. By means of a Fourier transform, acquired signals can be analyzed to identify respective locations of these signals in the selected slice by means of frequency encoding.

In addition, the phase-encoding gradient is typically applied before the readout gradient and after the slice selection gradient. For example, phase changes of precessing protons of a material are sequentially induced by using slightly different gradient amplitudes applied sequentially (in multiple consecutive TRs) during a data acquisition sequence. Therefore, the phase changes are applied linearly in the entire field of view, and the spatial location in the slice is encoded by the polarity and the degree of a phase difference accumulated with respect to a zero location. The phase-encoding gradient allows generation of phase differences between these spins of the material depending on the locations of the spins in the phase-encoding direction.

Figure 2:
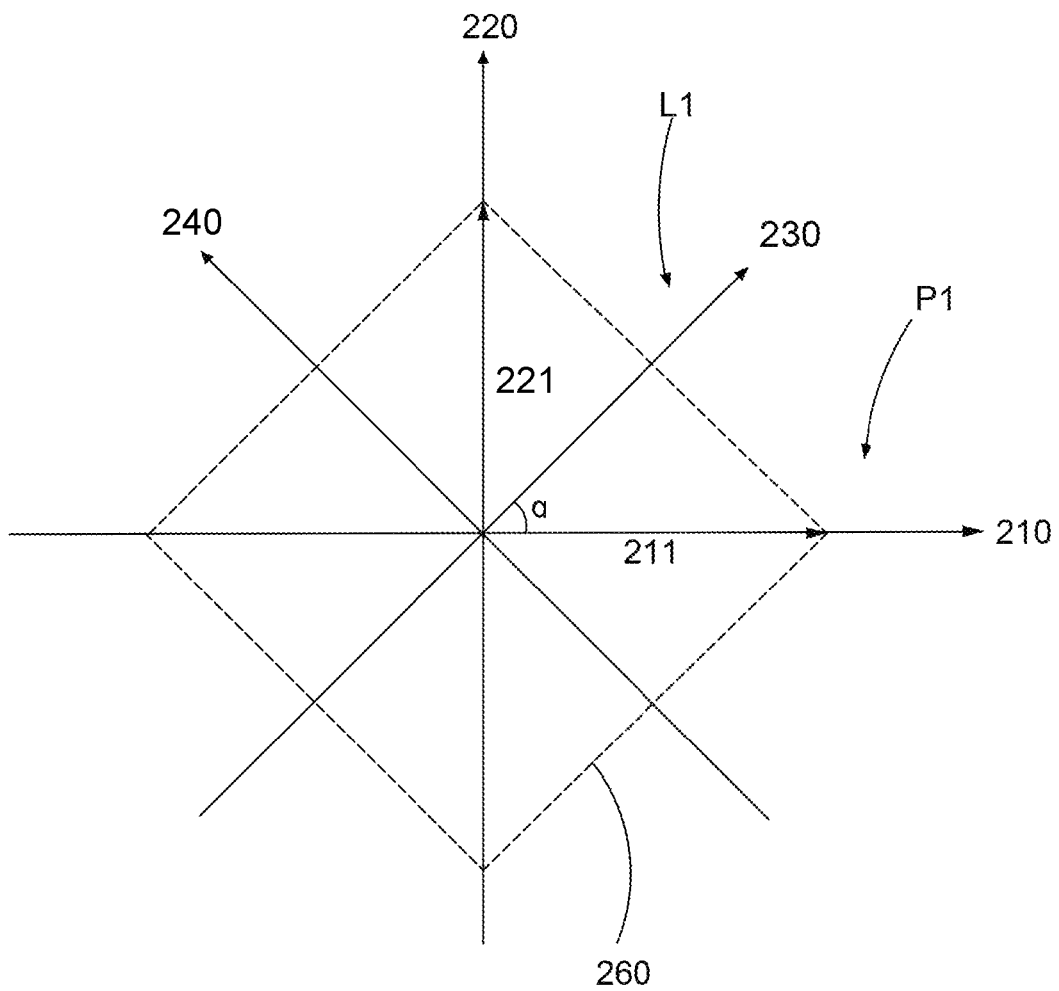
FIG. 2 shows a physical axis coordinate system P1 and a logical axis coordinate system L1 in an oblique scanning example.

FIG. 2 shows a physical axis-based coordinate system P1 and a logical axis-based coordinate system L1 in an example of oblique scanning. A first physical axis (X physical axis) 210, a second physical axis (Y physical axis) 220, a first logical axis (X logical axis) 230 rotated by an angle α (for example, 45 degrees) relative to the first physical axis 210, and a second logical axis (Y logical axis) 240 rotated by the angle α relative to the second physical axis 220 are defined. The X physical axis and the Y physical axis are driven by the Gx amplifier and the Gy amplifier, respectively. Due to hardware limitations, a gradient emitted by the gradient system has limitations on a maximum amplitude and a maximum switching speed. For example, maximum amplitudes 211 and 221 that can be achieved by the Gx amplifier and the Gy amplifier, respectively, are shown in FIG. 2.

When the oblique scanning is performed, it is necessary to determine integral over time of each gradient in a gradient waveform on the logical axis (namely, an area of the gradient waveform) on the basis of a preset scanning parameter (for example, slice direction, phase-encoding gradient value, TR, field of view (FOV), data acquisition bandwidth, data acquisition resolution, and the like), and a timing, an amplitude, a switching rate, and duration of the gradient are determined on the basis of the area of the gradient. Then, the gradient amplifier can drive, on the basis of the timing, amplitude, switching rate, duration, and the like, the gradient coil to emit a gradient field.

During determination of the gradient waveform, waveform design can be performed directly on the logical axis. In addition, in order to ensure a smaller TR, TE, EPS, and the like, a large waveform amplitude is configured to be on the logical axis. However, an amplitude of the logical axis actually consists of superposition of components of different physical axis gradients. For example, in FIG. 2, the first physical axis 210 separately contributes partial components to the first logical axis 230 and the second logical axis 240. If a large amplitude is configured to be on the logical axis, then the designed large amplitude may not be achieved due to a limitation imposed on the maximum amplitude of the physical axis.

In order to solve this problem, a further limitation needs to be imposed on the amplitude of the logical axis. For example, in a method, the amplitude of the logical axis is limited by a small box 260 shown in FIG. 2. That is, the amplitude of the logical axis cannot exceed the range defined by the box 260. However, this sacrifices utilization efficiency of gradient capacity, and is not conducive to reducing parameters such as TR and TE.

Although the two logical axes 230 and 240 are shown in FIG. 2 for simplicity, it should be understood that, in practice, three logical axes may be used. For example, if three logical axes are used, then the box 260 can be changed to a cube.

For some applications, such as during imaging performed by means of a balanced steady-state free precession sequence, in order to reach a balanced steady state of proton precession, the sum of waveform areas of all axes of the logical axis needs to be 0. In addition, in order to ensure a short TR, except for periods during which the radio frequency excitation pulse and the read gradient pulse are applied, the gradients applied to the three axes may overlap during certain periods.

Figure 3:
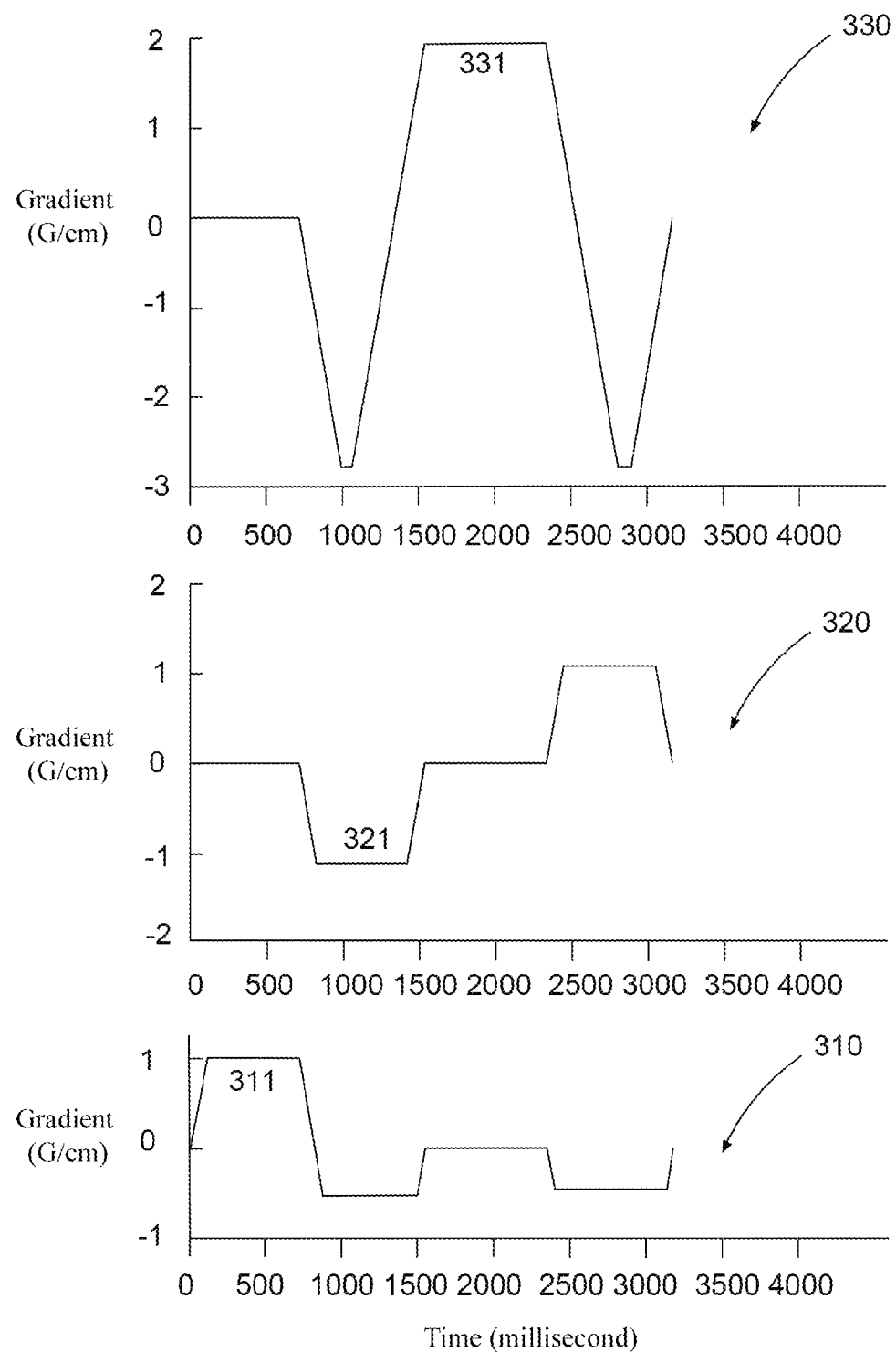
FIG. 3 shows a partial waveform diagram of a balanced steady-state free precession sequence used in orthogonal plane scanning.
Figure 4:
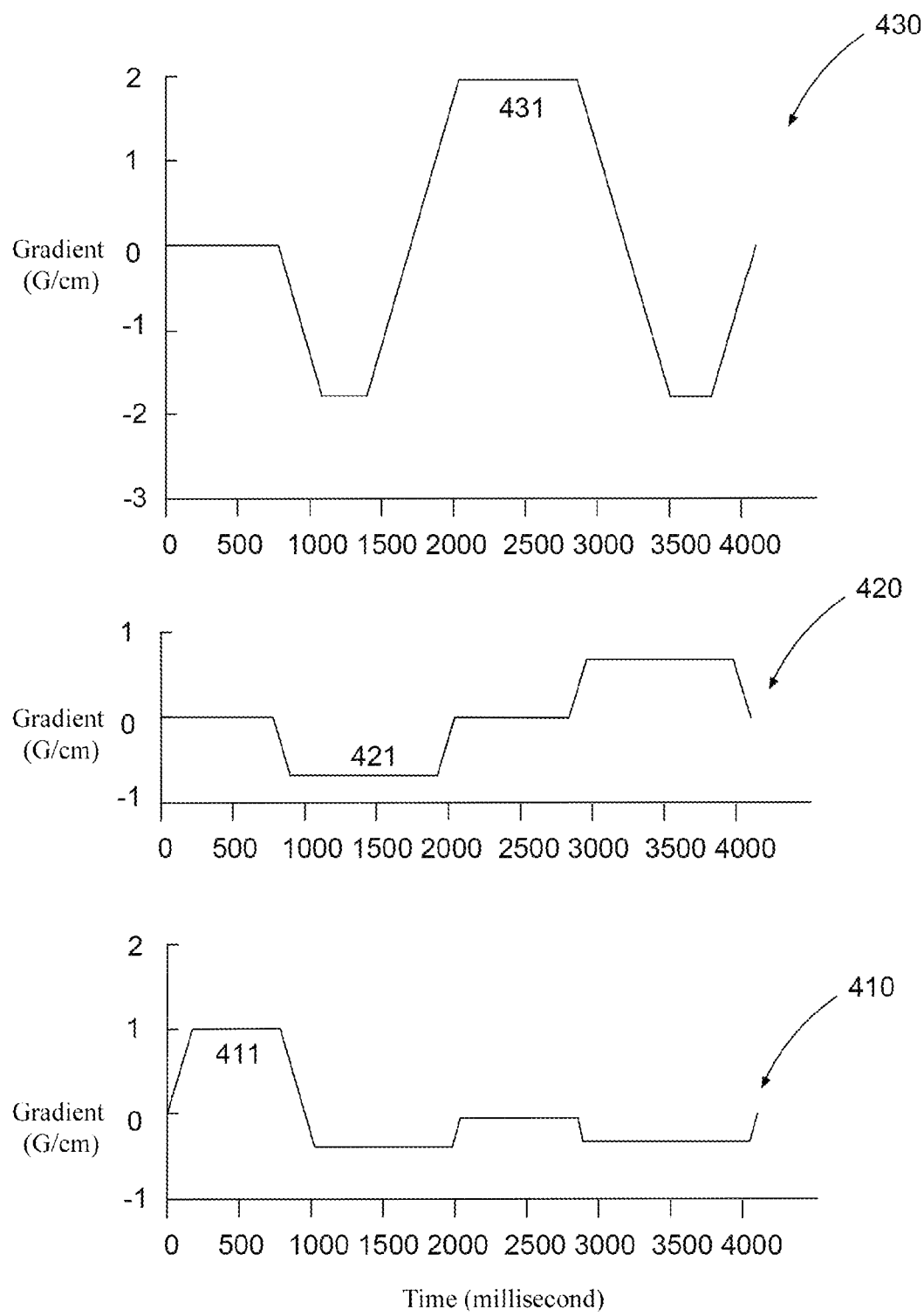
FIG. 4 shows a partial waveform diagram of a balanced steady-state free precession sequence used in oblique plane scanning.

FIG. 3 shows a partial waveform diagram of a balanced steady-state free precession sequence used in orthogonal plane scanning, and FIG. 4 shows a partial waveform diagram of a balanced steady-state free precession sequence used in oblique plane scanning. FIG. 3 and FIG. 4 show slice selection axes 310 and 410, phase-encoding axes 320 and 420, and frequency-encoding axes 330 and 430, respectively. In FIG. 3, the slice selection axis 310 has a slice selection gradient pulse 311, the phase-encoding axis 320 has a phase-encoding gradient pulse 321, and the frequency-encoding axis 330 has a read gradient pulse 331. In FIG. 4, the slice selection axis 410 has a slice selection gradient pulse 411, the phase-encoding axis 420 has a phase-encoding gradient pulse 421, and the frequency-encoding axis 430 has a read gradient pulse 431. Except for periods during which the slice selection gradient pulses 311 and 411 and the read gradient pulses 331 and 431 last, phase balance gradient pulses are further respectively applied to the slice selection axis, the phase-encoding axis, and the frequency-encoding axis, so that gradient areas on the three axes cancel each other out. Duration of the phase balance gradient pulse may overlap with duration of the phase-encoding gradient pulse.

In FIG. 3, since the physical axis coincides with the logical axis coincide, gradients can be applied at the slice selection axis 310, the phase-encoding axis 320, and the frequency-encoding axis 330 according to the maximum switching speed and the maximum amplitude (the maximum amplitude meeting an area requirement), so that duration of a corresponding gradient is short. Therefore, the sequence has small TR and TE.

In FIG. 4, since the maximum gradient magnitude and the maximum switching speed of the logical axis are limited to small values, it is necessary to obtain a required area by extending duration of the gradient magnitude, thereby extending TR and TE.

In some implementations, in order to improve utilization efficiency of gradient capacity and ensure small TR and TE, an initial gradient waveform can be designed/generated on the physical axis. Then, the initial gradient waveform is converted into a waveform on the logical axis, and the converted waveform is outputted. The outputted logical axis waveform can be re-converted into a physical axis waveform, so that the gradient amplifier can drive the gradient coil on the basis of the converted physical axis waveform.

Figure 5:
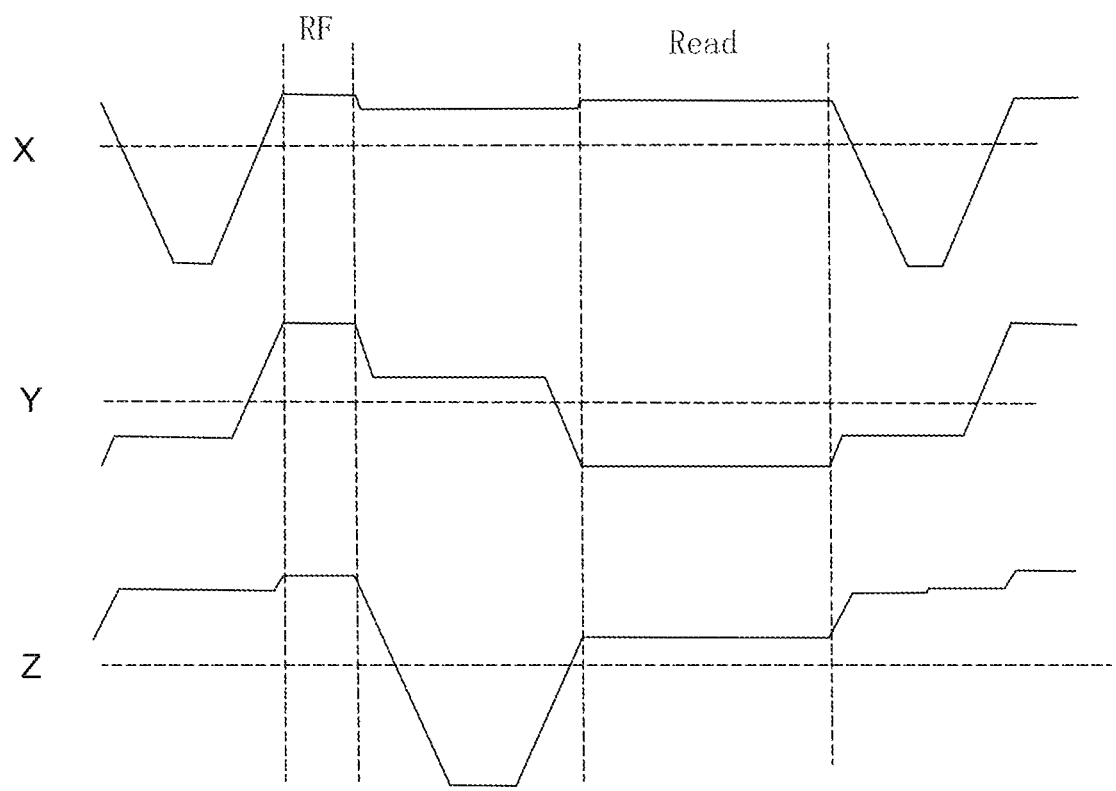
FIG. 5 shows an example of gradient sequence waveforms generated on physical axes.
Figure 6:
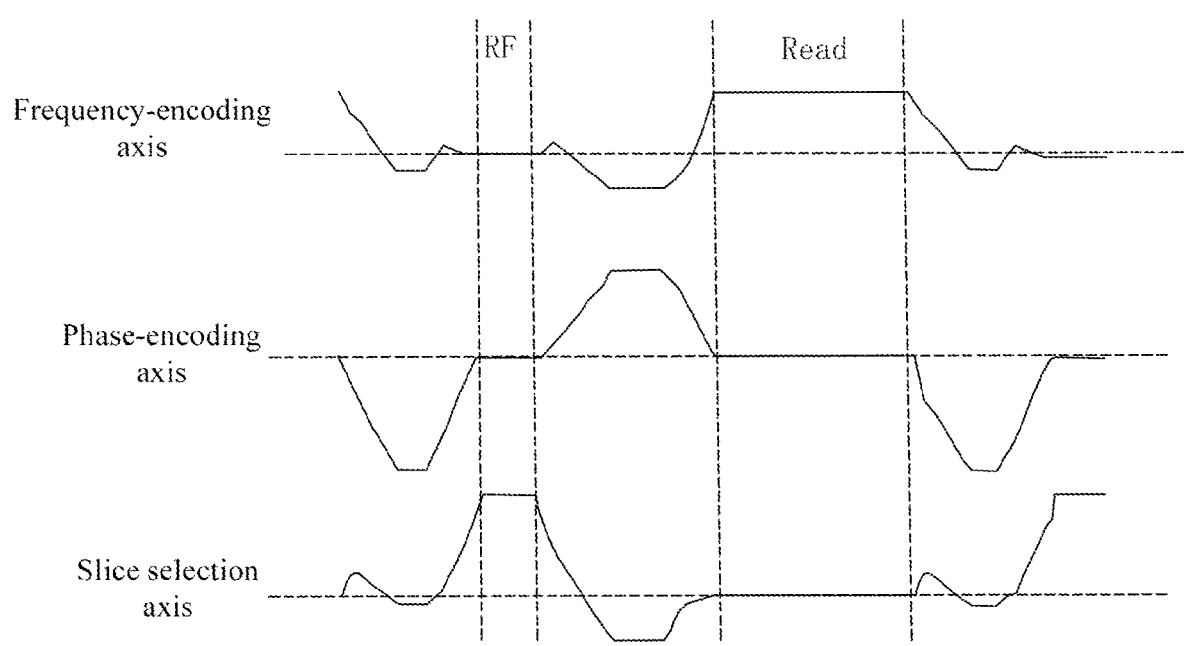
FIG. 6 shows a waveform diagram acquired by converting the waveforms shown in FIG. 5 into waveforms on logical axes.

FIG. 5 shows an example of gradient sequence waveforms generated on the physical axes, and FIG. 6 shows a waveform diagram acquired by converting the waveforms shown in FIG. 5 into waveforms on the logical axes, wherein a radio frequency excitation period RF and a read gradient period Read are included therein.

During design of the waveform shown in FIG. 5, a required area of each gradient pulse can be determined on the basis of the preset scanning parameter, and a waveform can be generated on the physical axis on the basis of the required area. An amplitude and a switching rate of the gradient waveform are determined according to the maximum bearing capacity of each physical axis.

During conversion of the waveform generated on the physical axis into a logical axis waveform, coordinate system conversion is performed. A relationship between the logical axis waveform and the physical axis waveform is as follows:

$$\begin{bmatrix} G_{logicX} \\ G_{logicY} \\ G_{logicZ} \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} G_{phyX} \\ G_{phyY} \\ G_{phyZ} \end{bmatrix} \quad (1)$$

where GphyX, GphyY, and GphyZ are gradient waveforms in the physical axis; GlogicX, GlogicY, and GlogicZ are gradient waveforms in the logical axis; and $$\begin{bmatrix} a_{11} & a_{12} & a_{13} \\ a_{21} & a_{22} & a_{23} \\ a_{31} & a_{32} & a_{33} \end{bmatrix}$$

is a 3×3 rotation matrix. As is well known in the art, elements of the rotation matrix are determined by a slice orientation.

By generating a gradient waveform on the physical axis, design can be directly performed on the basis of the maximum output amplitude and the maximum switching speed of each physical axis, thereby avoiding exceeding bearing capacity of hardware, effectively utilizing hardware gradient capacity, and ensuring a very small TR.

However, since the waveform is generated on the physical axis, since only the maximum gradient output of each physical axis is considered, and since the TR is maximally reduced, the waveform has many inflection points on the physical axis (as shown in FIG. 5), and the waveform is complex. In addition, as shown in FIG. 6, the converted logical axis waveform has more changes and many inflection points. When the system needs to calculate a gradient parameter of each physical axis on the basis of this logical axis waveform, the calculation is very complex and large memory consumption is required. For example, it is necessary to write/record a time of each inflection point of the logical axis waveform and an amplitude value at the time, and it is necessary to calculate an actual emitted gradient amplitude of the physical axis on the basis of the amplitude values at these times, so as to control a control parameter of the gradient amplifier with respect to the gradient coil.

In addition, as any related scanning parameter (for example, a different slice direction, a different phase-encoding gradient value/a different TR, a different field of view (FOV), a different data acquisition bandwidth, a different resolution, and the like) changes, the number of inflection points, and locations/times of the inflection points change accordingly. Therefore, it is necessary to constantly change the time of the inflection point, the number of inflection points, and the corresponding amplitude values that have been recorded, and it is necessary to continuously perform complex calculation so as to acquire the control parameter of the gradient amplifier.

Figure 7:
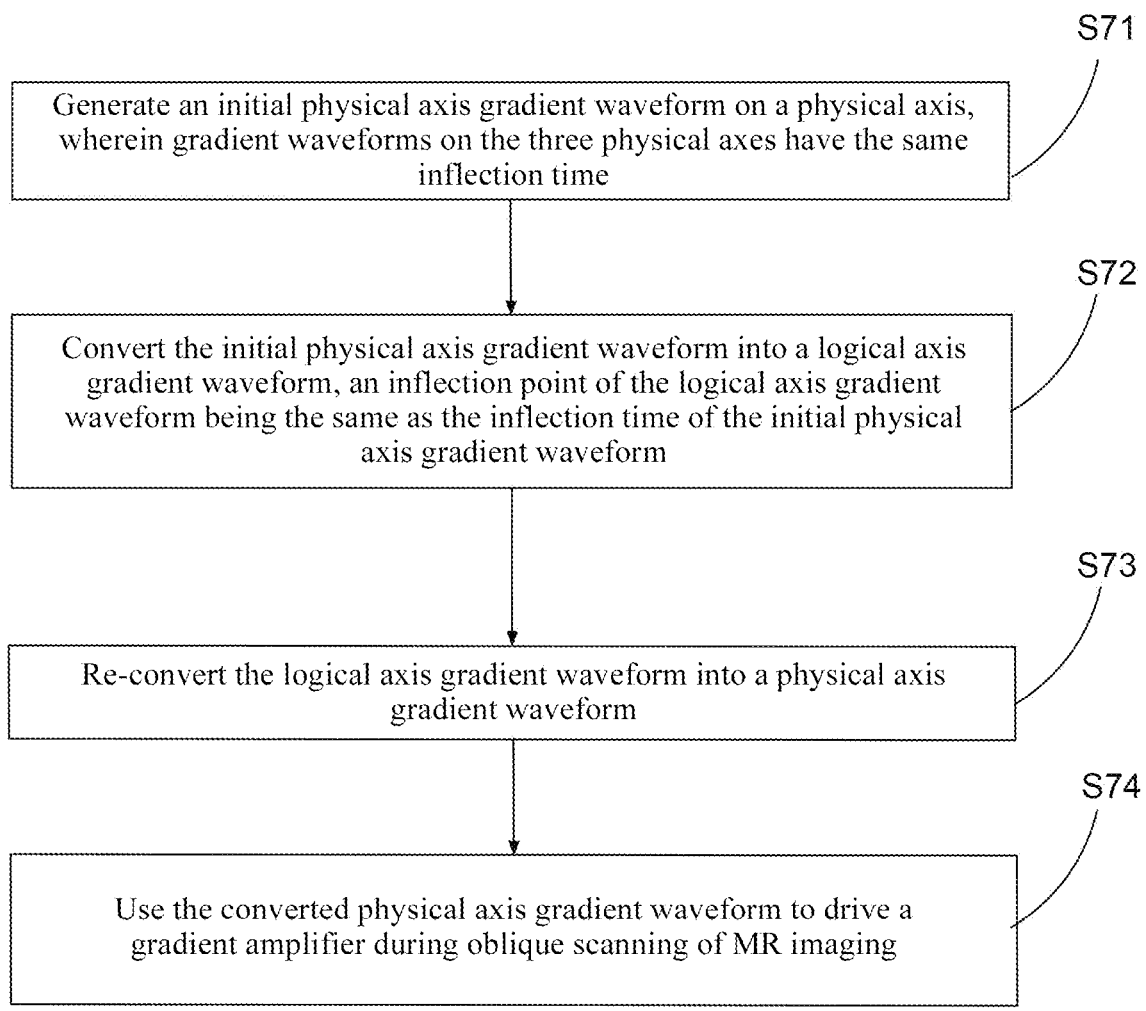
FIG. 7 schematically shows a flowchart of a method for determining a gradient waveform in oblique scanning according to some embodiments of the present invention.

The embodiments of the present invention therefore provide a method for determining a gradient waveform in oblique scanning. FIG. 7 shows a flowchart of an embodiment of the method.

As shown in FIG. 7, in step S71, an initial physical axis gradient waveform is generated on a physical axis. The physical axis includes a first physical axis, a second physical axis, and a third physical axis. Gradient waveforms on the first physical axis, the second physical axis, and the third physical axis have the same inflection time. In step S72, the initial physical axis gradient waveform is converted into a logical axis gradient waveform, an inflection point of the logical axis gradient waveform being the same as the inflection time of the initial physical axis gradient waveform. In step S73, the logical axis gradient waveform is re-converted into a physical axis gradient waveform, wherein this step may include calculating components and switching speeds of multiple physical axes with respect to magnitudes of respective logical axis gradient waveforms. In step S74, the converted physical axis gradient waveform is used to drive a gradient amplifier during oblique scanning of MR imaging. For example, control parameters of the gradient amplifier, such as a current amplitude and a switching rate, are configured on the basis of the physical axis gradient waveform.

The term "inflection point" refers to a time when an amplitude value of a waveform starts to transition from one changing trend (such as an uptrend, a downtrend, or a plateau) to another changing trend.

In an embodiment, in step S71, generating an initial physical axis gradient waveform on a physical axis may include the following three steps:

In a first step, an area requirement of each gradient waveform on a logical axis is determined on the basis of a predetermined scanning parameter.

In a second step, the area requirement of each gradient waveform on the logical axis is converted into an area requirement on the physical axis, and this can be achieved by means of the following formula (2):

$$\begin{bmatrix} G_{phyX} \\ G_{phyY} \\ G_{phyZ} \end{bmatrix} = \begin{bmatrix} b_{11} & b_{12} & b_{13} \\ b_{21} & b_{22} & b_{23} \\ b_{31} & b_{32} & b_{33} \end{bmatrix} \begin{bmatrix} G_{logicX} \\ G_{logicY} \\ G_{logicZ} \end{bmatrix}$$

where $$\begin{bmatrix} b_{11} & b_{12} & b_{13} \\ b_{21} & b_{22} & b_{23} \\ b_{31} & b_{32} & b_{33} \end{bmatrix}$$

is a coordinate conversion coefficient.

In a third step, the inflection time is determined on the basis of the area requirement on a corresponding physical axis, a maximum gradient emission amplitude of the physical axis, and a maximum gradient switching speed of the physical axis. For example, the waveform of the physical axis may be configured to have a maximum amplitude meeting the area requirement of the physical axis and a maximum switching speed.

In an embodiment, the waveforms generated on the physical axes are all simple trapezoids or triangles.

Figure 8:
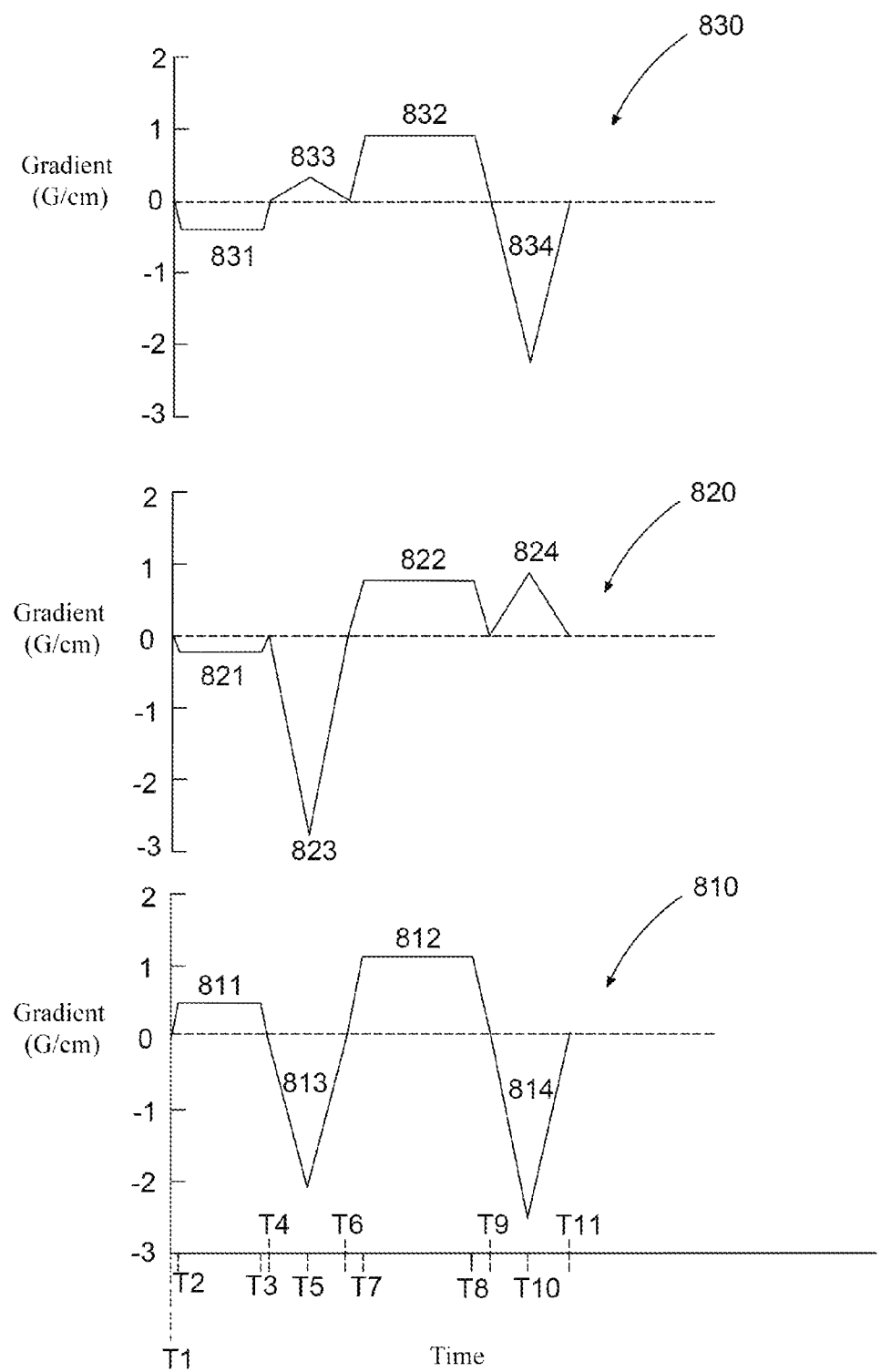
FIG. 8 shows an example of a physical axis gradient waveform.
Figure 9:
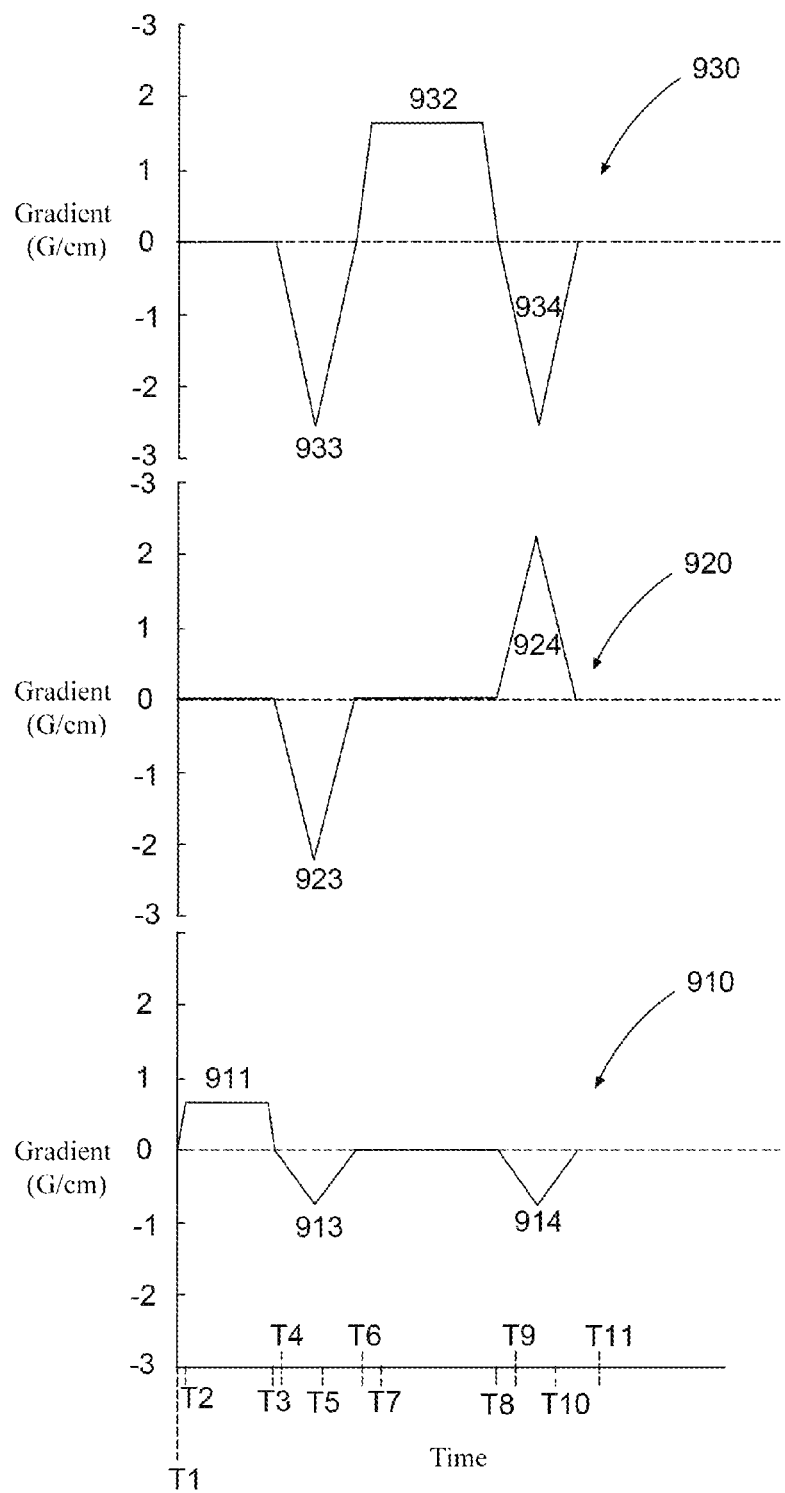
FIG. 9 shows an example of a logical axis gradient waveform generated by converting the physical axis gradient waveform.

FIG. 8 shows an example of the initial physical axis gradient waveform, and FIG. 9 shows an example of a logical axis gradient waveform generated by converting the physical axis gradient waveform. As shown in FIG. 8, a Z physical axis 810, a Y physical axis 820, and an X physical axis 830 are included, and gradient waveforms on the Z physical axis 810, the Y physical axis 820, and the X physical axis 830 have the same inflection time. For example, the physical axis gradient waveform shown in FIG. 8 has inflection points T1, T2, T3, and T4. A first pulse 811 having a first amplitude is formed on the Z physical axis 810 between the inflection points T2 and T3. The first pulse starts to rise from a zero amplitude at the inflection point T1, reaches a first amplitude value at the inflection point T2, starts to decrease in amplitude at the inflection point T3, and drops to the zero amplitude at the inflection point T4. Correspondingly, between the inflection points T2 and T3, a second pulse 821 having a second amplitude is formed on the Y physical axis 820. The second pulse starts to rise from the zero amplitude at the inflection point T1, reaches a second amplitude value at the inflection point T2, starts to decrease in amplitude at the inflection point T3, and drops to the zero amplitude at the inflection point T4. Similarly, between the inflection points T2 and T3, a third pulse 831 having a third amplitude is formed on the X physical axis

830. The third pulse starts to rise from the zero amplitude at the inflection point T1, reaches a third amplitude value at the inflection point T2, starts to decrease in amplitude at the inflection point T3, and drops to the zero amplitude at the inflection point T4. The first pulse 811, the second pulse 821, and the third pulse 831 are jointly converted (or superimposed) to produce a slice selection pulse 911 located on a slice selection axis 910 on the logical axis shown in FIG. 9.

Further, the physical axis gradient waveform shown in FIG. 8 has inflection points T5, T6, T7, T8, T9, T10, and T11. A fourth pulse 832 having a fourth amplitude is formed on the X physical axis 830 between the inflection points T7 and T8. The fourth pulse starts to rise from a zero amplitude at the inflection point T6, reaches a fourth amplitude value at the inflection point T7, starts to decrease in amplitude at the inflection point T8, and drops to the zero amplitude at the inflection point T9. Correspondingly, between the inflection points T7 and T8, a fifth pulse 822 having a fifth amplitude is formed on the Y physical axis 820. The fifth pulse starts to rise from the zero amplitude at the inflection point T6, reaches a fifth amplitude value at the inflection point T7, starts to decrease in amplitude at the inflection point T8, and drops to the zero amplitude at the inflection point T9. Similarly, between the inflection points T7 and T8, a sixth pulse 812 having a sixth amplitude is formed on the Z physical axis 810. The sixth pulse 812 starts to rise from the zero amplitude at the inflection point T6, reaches a sixth amplitude value at the inflection point T7, starts to decrease in amplitude at the inflection point T8, and drops to the zero amplitude at the inflection point T9. The fourth pulse 832, the fifth pulse 822, and the sixth pulse 812 are jointly converted (or superimposed) to produce a read gradient pulse 932 located on a frequency-encoding axis 920 on the logical axis shown in FIG. 9.

Continue to refer to FIG. 8, at the inflection point T5, a seventh gradient pulse 833, an eighth gradient pulse 823, and a ninth gradient pulse 813 are generated on the X physical axis 830, the Y physical axis 820, and the Z physical axis 810, respectively. The seventh to ninth gradient pulses 833, 823, and 813 separately start to rise from zero at the inflection point T4, respectively reach a seventh amplitude, an eighth amplitude, and a ninth amplitude at the inflection point T5, fall subsequently, and drop to the zero magnitude at the inflection point T6. In addition, the seventh to ninth gradient pulses 833, 823, and 813 are jointly converted (or superimposed) to produce the phase balance gradient pulses 913, 923, and 933 shown in FIG. 9, respectively. The phase balance gradient pulses 913, 923, and 933 are located on the slice selection axis 910, the phase-encoding axis 920, and a frequency-encoding axis 930, respectively.

Similarly, as shown in FIG. 8, at the inflection point T10, a tenth gradient pulse 834, an eleventh gradient pulse 824, and a twelfth gradient pulse 814 are generated on the X physical axis 830, the Y physical axis 820, and the Z physical axis 810, respectively. The tenth to twelfth gradient pulses 834, 824, and 814 separately start to rise from zero at the inflection point T9, respectively reach a tenth amplitude, an eleventh amplitude, and a twelfth amplitude at the inflection point T10, fall subsequently, and drop to the zero magnitude at the inflection point T11. In addition, the tenth to twelfth gradient pulses 834, 824, and 814 are jointly converted (or superimposed) to produce the phase balance gradient pulses 914, 924, and 934 shown in FIG. 9, respectively. The phase balance gradient pulses 914, 924, and 934 are located on the slice selection axis 910, the phase-encoding axis 920, and the frequency-encoding axis 930, respectively.

Optionally, step S73 includes the following steps: a) recording an inflection time of the logical axis gradient waveform and a waveform amplitude of the inflection time; and b) calculating, on the basis of the recorded inflection time and the corresponding waveform amplitude, switching rates and amplitudes of the gradient waveforms on the first physical axis, the second physical axis, and the third physical axis.

In an example, the inflection time of the logical axis gradient waveform and the waveform amplitude of the inflection time may be recorded in a computer system of the magnetic resonance imaging system in a form of the following table or a similar form.

| Inflection time | T1 | T2 | T3 | ... | Tn |
|---|---|---|---|---|---|
| Waveform amplitude on slice selection axis | $A_Z1$ | $A_Z2$ | $A_Z3$ | | $A_Zn$ |
| Waveform amplitude on phase-encoding axis | $A_Y1$ | $A_Y2$ | $A_Y3$ | | $A_Yn$ |
| Waveform amplitude on frequency-encoding axis | $A_X1$ | $A_X2$ | $A_X3$ | | $A_Xn$ |

When a related scanning parameter is changed, the value of n remains unchanged, but time values of T1-Tn and corresponding amplitude values are changed.

During calculation, the known coordinate conversion coefficient (shown in formula (1)) and the waveform amplitude on each axis of the logical axis are used to calculate a contribution (or component) of each physical axis to a corresponding waveform amplitude at a corresponding time.

The number of inflection points and the locations of the inflection points shown in FIG. 8 and FIG. 9 can be increased or decreased depending on requirements. However, the inflection times on the X, Y, and Z physical axes are configured to be consistent with each other (for example, starting at the same time, ending at the same time, stopping rising at the same time, and dropping at the same time, etc); therefore, during a period in which a pulse waveform on one physical axis lasts (after a time when application is started and before a time when the application ends), applying or ending another pulse waveform on another physical axis is avoided. Hence, fewer inflection points are generated. In addition, once the number of inflection points is determined, no matter how the scanning parameter is modified, the number of inflection points does not change. This causes the number of inflection points of the converted logical axis gradient waveform to be also small and fixed, so that during calculation of the control parameter of the gradient amplifier, it is not necessary to perform a large number of calculations, and it is not necessary to write an overly large number of inflection times and corresponding amplitude values into the system. In addition, since the gradient waveform is still generated on the physical axis, gradient emission capability of the hardware can be leveraged, and a gradient waveform having a large amplitude and corresponding small TR and TE can be acquired.

The method according to the embodiments of the present invention can be applied to a balanced steady-state precession sequence, so that a sufficiently small TR can be acquired by means of a high hardware capacity utilization rate and a low calculation burden/memory consumption, and that image artifacts caused by the balanced steady-state precession sequence being sensitive to the uniformity of the main magnetic field can be eliminated.

The aforementioned balanced steady-state precession sequence may include, for example, a fast imaging employing steady-state acquisition (FIESTA) sequence, a true fast image steady-state precession (TrueFISP) sequence, or another sequence having a similar function.

The embodiments of the present invention may further provide a computer-readable storage medium, including a stored computer program, wherein the method for determining a gradient waveform of oblique scanning according to any one of the aforementioned embodiments of the present invention is performed when the computer program is run.

On the basis of the above description, an embodiment of the present invention may provide a magnetic resonance imaging system having a gradient coil assembly, including a first gradient coil, a second gradient coil, and a third gradient coil. The first gradient coil, the second gradient coil, and the third gradient coil define a first physical axis, a second physical axis, and a third physical axis, respectively. The system has a gradient coil driver, including a first gradient amplifier, a second gradient amplifier, and a third gradient amplifier coupled to the first gradient coil, the second gradient coil, and the third gradient coil, respectively; and a processor, communicatively coupled to the gradient coil driver. The processor is configured to perform the following steps: a) generating an initial physical axis gradient waveform on the physical axis, wherein gradient waveforms on the first physical axis, the second physical axis, and the third physical axis have the same inflection time; b) converting the initial physical axis gradient waveform into a logical axis gradient waveform, an inflection time of the logical axis gradient waveform being the same as the inflection time of the initial physical axis gradient waveform; c) re-converting the logical axis gradient waveform into a physical axis gradient waveform; and d) using, during the oblique scanning of magnetic resonance imaging, the converted physical axis gradient waveform to drive the first gradient amplifier, the second gradient amplifier, and the third gradient amplifier.

Figure 10:
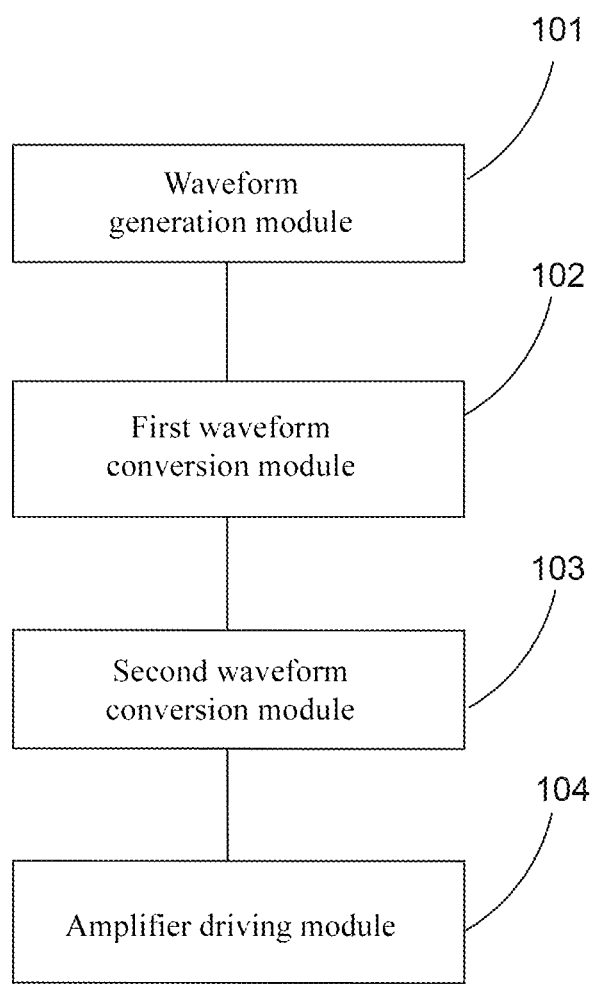
FIG. 10 shows a block diagram of a device for determining a gradient waveform of oblique plane scanning according to some embodiments of the present invention.

FIG. 10 shows a block diagram of a device for determining a gradient waveform of oblique plane scanning according to an embodiment of the present invention. The device includes the following modules: a) a waveform generation module 101 for generating an initial physical axis gradient waveform on a physical axis, the physical axis including a first physical axis, a second physical axis, and a third physical axis, wherein gradient waveforms on the first physical axis, the second physical axis, and the third physical axis included in the physical axis have the same inflection time; b) a first waveform conversion module 102 for converting the initial physical axis gradient waveform into a logical axis gradient waveform, an inflection point of the logical axis gradient waveform being the same as the inflection time of the initial physical axis gradient waveform; c) a second waveform conversion module 103 for re-converting the logical axis gradient waveform into a physical axis gradient waveform; and d) an amplifier driving module 104 for using, during the oblique scanning of magnetic resonance imaging, the converted physical axis gradient waveform to drive a gradient amplifier.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A method for determining a gradient waveform of oblique scanning, the method comprising:
generating an initial physical axis gradient waveform on a physical axis, the physical axis comprising a first physical axis, a second physical axis, and a third physical axis, wherein gradient waveforms on the first physical axis, the second physical axis, and the third physical axis have the same inflection time;
converting the initial physical axis gradient waveform into a logical axis gradient waveform, an inflection point of the logical axis gradient waveform being the same as the inflection time of the initial physical axis gradient waveform;
re-converting the logical axis gradient waveform into a physical axis gradient waveform; and
using, during the oblique scanning of magnetic resonance imaging, the converted physical axis gradient waveform to drive a gradient amplifier.

2. The method according to claim 1, wherein the step of re-converting the logical axis gradient waveform into a physical axis gradient waveform comprises:
recording an inflection time of the logical axis gradient waveform and a waveform amplitude of the inflection time; and
calculating, on the basis of the recorded inflection time and the corresponding waveform amplitude, switching speeds and amplitudes of the gradient waveforms on the first physical axis, the second physical axis, and the third physical axis.

3. The method according to claim 1, wherein the step of generating an initial physical axis gradient waveform on a physical axis comprises:
determining an area requirement of each gradient waveform on a logical axis on the basis of a predetermined scanning parameter;
converting the area requirement of each gradient waveform on the logical axis into an area requirement on the physical axis; and
determining the inflection time on the basis of the area requirement on a corresponding physical axis, a maximum gradient emission amplitude of the physical axis, and a maximum gradient switching speed of the physical axis.

4. The method according to claim 1, wherein a scanning sequence used by the oblique scanning comprises a balanced steady-state precession sequence, wherein within one repetition time of the sequence, the sum of areas of gradient waveforms applied to a frequency-encoding axis, a phase-encoding axis, and a slice selection axis is 0.

5. A computer-readable storage medium, comprising a stored computer program, wherein the method of claim 1 is performed when the computer program is run.

6. A magnetic resonance imaging system, comprising:
a gradient coil assembly, comprising a first gradient coil, a second gradient coil, and a third gradient coil, the first gradient coil, the second gradient coil, and the third gradient coil defining a first physical axis, a second physical axis, and a third physical axis, respectively;
a gradient coil driver, comprising a first gradient amplifier, a second gradient amplifier, and a third gradient amplifier coupled to the first gradient coil, the second gradient coil, and the third gradient coil, respectively; and a processor, communicatively coupled to the gradient coil driver and configured to perform the following:

generating an initial physical axis gradient waveform on the physical axis, wherein gradient waveforms on the first physical axis, the second physical axis, and the third physical axis have the same inflection time;

converting the initial physical axis gradient waveform into a logical axis gradient waveform, an inflection time of the logical axis gradient waveform being the same as the inflection time of the initial physical axis gradient waveform;

re-converting the logical axis gradient waveform into a physical axis gradient waveform; and using, during the oblique scanning of magnetic resonance imaging, the converted physical axis gradient waveform to drive the first gradient amplifier, the second gradient amplifier, and the third gradient amplifier.

7. The system according to claim 6, wherein the processor is configured to perform the following:

recording an inflection time of the logical axis gradient waveform and a waveform amplitude of the inflection time; and calculating, on the basis of the recorded inflection time and the corresponding waveform amplitude, switching speeds and amplitudes of the gradient waveforms on the first physical axis, the second physical axis, and the third physical axis.

8. The system according to claim 6, wherein the processor is configured to perform the following:

determining an area requirement of each gradient waveform on a logical axis on the basis of a predetermined scanning parameter;

converting the area requirement of each gradient waveform on the logical axis into an area requirement on the physical axis; and determining the inflection time on the basis of the area requirement on a corresponding physical axis, a maximum gradient emission amplitude of the physical axis, and a maximum gradient switching speed of the physical axis.

9. The system according to claim 6, wherein a scanning sequence used by the oblique scanning comprises a balanced steady-state precession sequence, wherein within one repetition time of the sequence, the sum of areas of gradient waveforms applied to a frequency-encoding axis, a phase-encoding axis, and a slice selection axis is 0.

10. A device for determining a gradient waveform of oblique scanning, the device comprising:

a waveform generation module for generating an initial physical axis gradient waveform on a physical axis, the physical axis comprising a first physical axis, a second physical axis, and a third physical axis, wherein gradient waveforms on the first physical axis, the second physical axis, and the third physical axis have the same inflection time;

a first waveform conversion module for converting the initial physical axis gradient waveform into a logical axis gradient waveform, an inflection point of the logical axis gradient waveform being the same as the inflection time of the initial physical axis gradient waveform;

a second waveform conversion module for re-converting the logical axis gradient waveform into a physical axis gradient waveform; and an amplifier driving module for using, during the oblique scanning of magnetic resonance imaging, the converted physical axis gradient waveform to drive a gradient amplifier.

* * * * *